United States Patent [19]

Gössl et al.

[11] Patent Number: 4,806,059
[45] Date of Patent: Feb. 21, 1989

[54] STACKING DEVICE FOR UNIFORM, ESPECIALLY PLATELIKE PIECES

[75] Inventors: Erhard Gössl; Hans Lutz, both of Gerlingen; Peter Schöttle, Stuttgart, all of Fed. Rep. of Germany

[73] Assignee: Robert Bosch GmbH, Stuttgart, Fed. Rep. of Germany

[21] Appl. No.: 33,120

[22] PCT Filed: May 14, 1986

[86] PCT No.: PCT/DE86/00202

§ 371 Date: Feb. 11, 1987

§ 102(e) Date: Feb. 11, 1987

[87] PCT Pub. No.: WO86/07520

PCT Pub. Date: Dec. 18, 1986

[30] Foreign Application Priority Data

Jun. 12, 1985 [DE] Fed. Rep. of Germany ....... 3521010

[51] Int. Cl.[4] .................. B65G 65/00; H05K 13/02
[52] U.S. Cl. .................................. 414/331; 118/45; 414/787; 414/789.5; 414/793.6
[58] Field of Search ............... 414/331, 42, 787, 78; 118/45

[56] References Cited

U.S. PATENT DOCUMENTS

| 3,418,895 | 12/1968 | Palmer | 414/47 X |
| 3,613,911 | 10/1971 | Walchhuter et al. | 414/331 |
| 3,995,748 | 12/1976 | Looney | 414/71 X |
| 4,264,253 | 4/1981 | Kennison | 414/42 |
| 4,285,630 | 8/1981 | Manini et al. | 414/331 X |

FOREIGN PATENT DOCUMENTS 2229254 1/1974 Fed. Rep. of Germany .
3232611 3/1984 Fed. Rep. of Germany .

OTHER PUBLICATIONS

Wafer Buffer-IBM Technical Disclosure Bulletin, vol. 18, No. 11, Apr. 1976, Hanscom et al.

Primary Examiner—Robert J. Spar
Assistant Examiner—David A. Bucci
Attorney, Agent, or Firm—Michael J. Striker

[57] ABSTRACT

A stacking device for uniform platelike pieces includes a conveying device and a container in which the pieces, which are advanced by the conveying device, are deposited with the front side of one piece against the back side of another. In order to protect the coated surface of the pieces the latter are separated from one another by means of intermediate layers separately fed into the container.

10 Claims, 3 Drawing Sheets

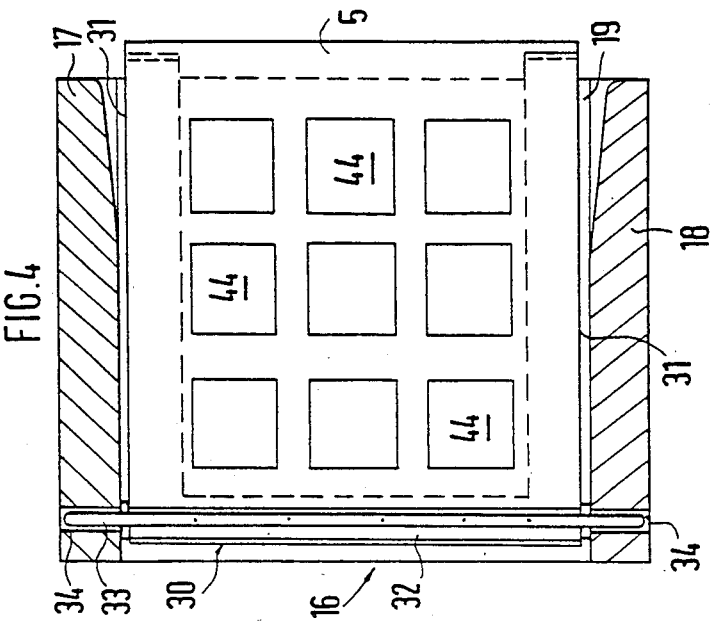
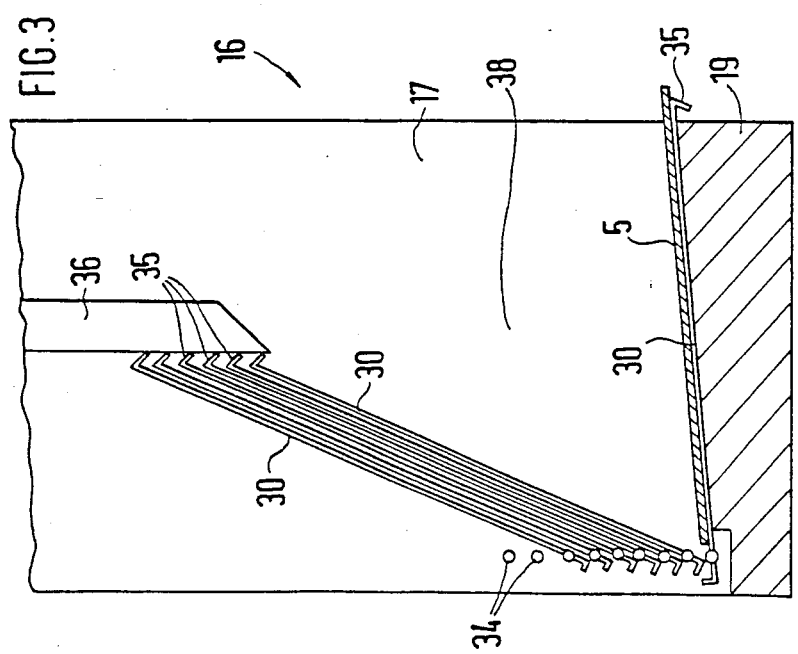

STACKING DEVICE FOR UNIFORM, ESPECIALLY PLATELIKE PIECES

BACKGROUND OF THE INVENTION

The present invention relates to a stacking device. It is known to place uniform, especially platelike pieces on a conveyor belt individually from a supply device and to stack them in a container after running through one or more processing stations. Thus, for example, circuits of small dimensioning are produced in series production where a plurality of small surfaces of determined configurations on a thin metal plate having a relatively large surface area are first coated with insulating material, for example, glass or ceramic material. A conductor layer consisting of tantalum, for example, is then applied to this plate. This is effected, as a rule, by means of steaming on or dusting on the coating material in a receptacle which can be evacuated. The method is effected in that plates are introduced into a vacuum chamber (receptable) which contains a target consisting of a coating material, an atomizing gas, e.g. argon, is then introduced into the chamber at reduced pressure, and an electrical voltage is applied to the target in order to generate a plasma between the target and the plate so that a coat of target material is precipitated on the plate. The passage of the plates through the coating station is effected in a continuous manner at the speed determined by the conveyor belt. Next, the plates, which are coated on one side and over their entire surface area, are stacked in a container arranged within the chamber and remain in the container until they have cooled sufficiently. The plates brought foward by the conveying device are deposited in the container in such a way that the layer side and the back side of two adjacent plates lie one on top of the other.

The plates removed from the container are engraved outside of the chamber in order to produce the conductor texture. The surface formation is then punched out of the plate and provided with connection wires.

Plates which were stacked in the vacuum chamber in the manner described above showed differing engraving behavior in the area of the insulating layer in subsequent engraving processes. The conductor layer was very difficult to engrave in some places on the coated surfaces and therefore led to undercuts in other places. The reason for this is that the relative movements of the stacked plates cause an abrasion of the back sides of the plates, which are not coated, and, in addition, the weight of the stack on the raised places on the insulating layer produces pressure marks within which the coating material is compressed.

SUMMARY OF THE INVENTION

It is an object of the present invention to provide a stacking device by means of which an abrasion and pressing down of the back sides of the plates on the layer side of the plates above them should be avoided. This and other objects of the invention are attained by a stacking device in which deposited pieces are separated from each other by separately fed intermediate layers. Accordingly, the engraving behavior of the extremely thin conductor layers can be decisively improved and the reject rate can be reduced. The receiving capacity of the piece container is not substantially reduced through the use of intermediate layers, since the latter can consist of very thin material having a smooth surface. In addition to the protection of conductor plates of the described type, the intermediate layers can also serve to protect other stackable pieces with a uniform shape, whose surfaces have a sensitive material and/or textural structure. Stackable pieces, which can be accommodated in frames if their shape or their fragility makes immediate stacking impossible, are disclosed in West German Pat. No. DE-OS 22 29 254. These pieces are inserted in frames already before stacking, a stacking being made possible only by means of this frame.

It is particularly advantageous that the intermediate layers be constructed as inherently rigid frames which contact the edge areas of the front and back sides of the deposited pieces. The width of these frames can be dimensioned in such a way that they only contact the plate outside of a useful area which is to be protected. Accordingly, in each instance, there arises between two adjacent plates an intermediate space which ensures a uniform cooling of previously heated plates. It is particularly suitable for automatically working stacking devices that the intermediate layers are stacked in a magazine and that a device for transporting or releasing an intermediate layer between two successive deposited pieces is provided in the magazine. A space-saving construction can accordingly be achieved in that the magazine and the device for transporting or releasing the intermediate layers are arranged within the container serving to receive the pieces. A special magazine for the intermediate layers is unnecessary if, according to another characteristic feature of the invention, the container receiving the pieces to be deposited is constructed as a magazine for the intermediate layers. A particularly advisable construction, which works with gravitational froce and requires only a releasing device for the intermediate layers, includes the container which opens toward the conveying device and is movable in the direction opposite the stacking direction during the stacking process, and wherein the intermediate layers are supported such that a space is left open for depositing a piece in the container.

BRIEF DESCRIPTION OF THE DRAWING

FIG. 3 shows a portion of the stacking container, shown in FIG. 1, in longitudinal section; and FIG. 4 shows the container, according to FIG. 3, in cross section.

DETAILED DESCRIPTION OF THE PREFERRED EMBODIMENTS

Figure 1:
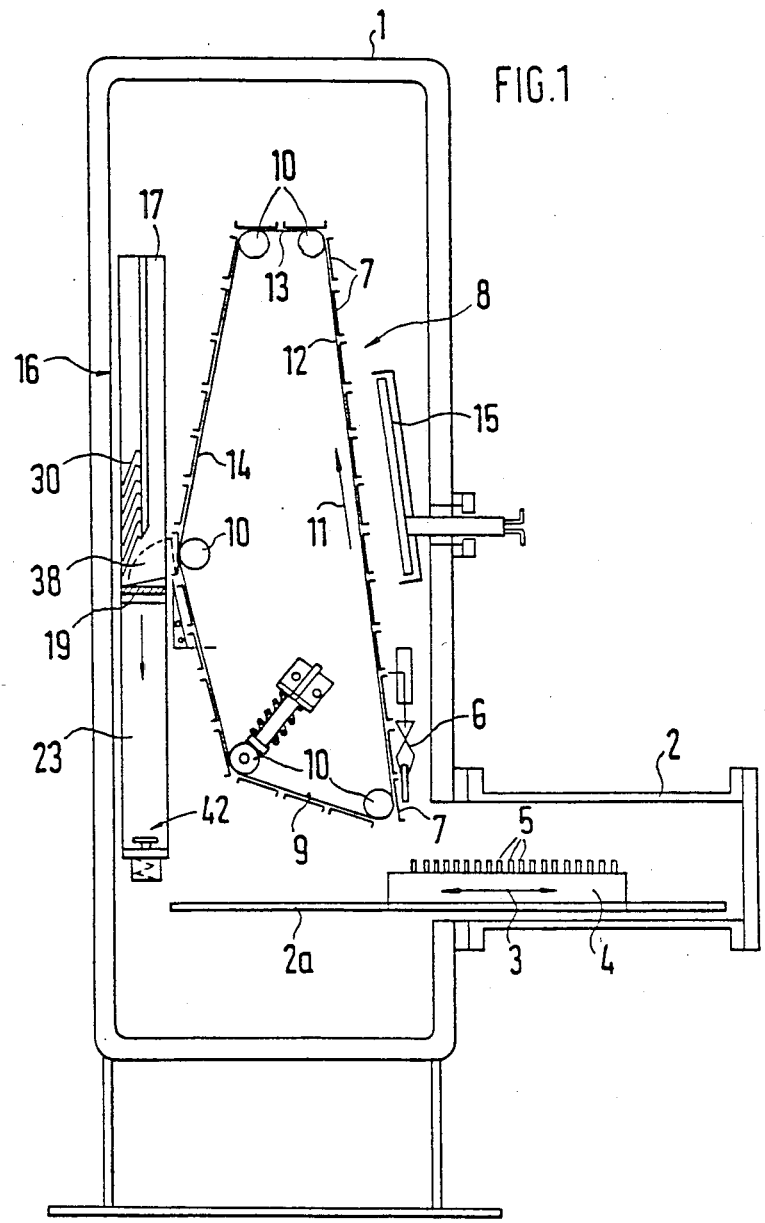
FIG. 1 shows a stacking device in schematic form, which is integrated in a coating installation.
Figure 2:
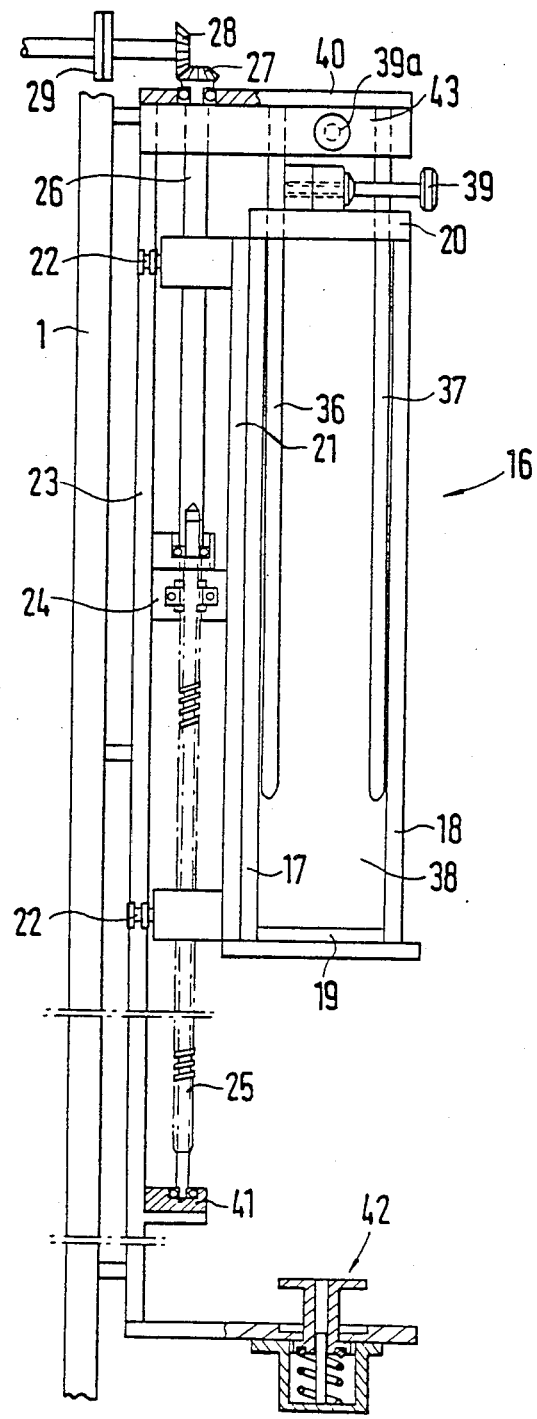
FIG. 2 shows an enlarged view with details of the stacking device according to FIG. 1.

In FIG. 1 a housing, which is closable so as to be vacuum-tight, is designated by reference numeral 1; a transfer duct 2 for introducing a rod supply magazine 4, which is movable on rails 2a in the direction of the double arrow 3, is fastened to the housing 1. The magazine 4 is filled with metal plates 5, one of the surfaces of which is to be coated with a conductor substrate, for example, tantalum. Arranged above the supply magazine 4 in the housing 1, is a clamp-type gripping device 6, which is movable up and down in the vertical direction and which removes plates 5 individually from the magazine 4 and raises them until they are grasped by the edge of the upwardly running substrate receivers 7 of a conveying device 8, which substrate receivers 7 are provided with angles. The conveying device has a continuous conveyor belt 9 which runs along deflecting rollers 10, at least one of which is spring-biased. The conveyor belt 9 is driven in the direction of arrow 11. The substrate receivers 7, which are rigid per se, are fastened on the conveyor belt in such a way that they follow its deflection without changing shape. The conveyor belt 9 has an inclined upwardly extending portion 12 which merges into a horizontal portion 13 of the conveyor belt. An inclined downwardly directed portion 14 adjoins this portion 13. At the end of the portion 14 marked by a deflecting roller 10, is located the place where the pieces 5 are ejected from the conveyor belt 9 by means of tilting the substrate receivers 7. It is advisable that the conveyor belt have two parallel link chains which engage with a toothing of the deflecting rollers and are fastened between the substrate receivers 7.

The substrate coating zone, from which FIG. 1 shows a water-cooled cathode 15 with the material to be dusted on, the cathode 15 being connected to a high-frequency generator, is located in the area of portion 12 of the conveyor belt 9.

The plates 5, which are coated and ejected from the conveyor belt 9 by means of tilting the substrate receivers 7, fall, with their layer side facing down, into a stacking container 16 which opens toward the conveyor belt 9, is constructed as a shaft and has two parallel side walls 17, 18, a floor 19 and a connecting bar 20. The container 16 is positioned on a supporting angle 21 which is guided on a rail 23, attached to the housing 1, by means of a plurality of rollers 22 so as to be movable in a vertical direction. A nut 24, which is penetrated by a threaded spindle 25, is fastened to the carrying angle 21. The spindle 25 is supported at the guide rail 23 at its end, while its other end is connected with a shaft 26 so as to be fixed against rotation relative to it, the shaft 26 being drivable by means of an angular drive, which consists of two bevel gears 27, 28, and a detachable coupling 29 of a motor, not shown. The nut 24 is divided, i.e. it consists of two threaded half shells which permit a displacement of the supporting angle 21 with respect to the threaded spindle 25 in the opened state.

In order to protect the sensitive layer sides of the plates 5, which are stacked in the container 16, intermediate layers 30 are provided, which are introduced between two consecutive plates 5 during the stacking process. As can be seen from FIG. 4, these intermediate layers are constructed as frames which only contact the edge areas of the layer and back sides of the stacked plates 5. Each of the frames, which are open toward the conveyor belt 9, is formed of two parallel sides 31 and a transverse web 32 connecting the latter. In the vicinity of the rear defining edge, an axle 33 is attached at the web. Axle 33 engages the boreholes 34 which are formed in the parallel side walls 17, 18 of the container 16. The boreholes lie vertically one above the other.

The parallel sides 31 of the frame are bent down at their free end. They are supported by these bent down portions 35 at two bars 36, 37 which run parallel to one another and extend within the container in the movement direction of same. The bars 36, 37 form a device for releasing a frame during the operation of the installation. An open space 38 for the tilting of the coated plates 5 into the container 16 from the conveyor belt 9 is located between the free ends of the bars 37, 38 and the floor of the container 16.

The container 16 and the bars 36, 37 are connected with one another by means of a threaded screw 39 so as to be detachable. Another threaded screw 39a serves for the detachable fastening of the bars 36, 37 on a plate 40 of the magazine arrangement.

The threaded spindle 25 is rotated above its lower support 41 in an unobstructed manner so that the nut 24 does not jam when the container 16 is filled but the drive is not yet disengaged. In order to reduce the load of the last thread of the spindle 25 due to the filled container 16, there is provided, in addition, a dish 42 which is spring-biased in the vertical direction and against which the supporting angle 21 strikes at the end of the stacking process when the container is entirely lowered.

The device according to the invention operates in the following manner:

After emptying, the container 16, which is taken out of the housing 1, is tilted in such a way that the intermediate layers 30 are aligned approximately parallel to the longitudinal edges of the side walls 17, 18 of the container. The two bars 36, 37, which are connected with one another at one end by means of a web 43, are then introduced into the container 16 by means of two recesses formed in the connecting bar 20 and are fastened to it by means of the threaded screw 39. The intermediate layers 30 are brought into the position shown in FIG. 3 by means of setting the container 16 upright and tilting the same; in this position they are supported at the bars 36, 37 by their bent portions 35 in an inclined position. Now, the container 16 can be placed on the supporting angle 21 in the housing 1. The supporting angle 21 is then moved upward with the container 16 with opened nut 24 until the threaded screw 39a can be attached to the plate 40 of the magazine apparatus in order to fasten the bars 36, 37. The nut 24 is closed and the threaded screw 39 is removed. The container 16 is accordingly positioned on the supporting angle 21, which is held by means of the threaded spindle 25, while the bars 36, 37 are held by the plate 40 of the magazine apparatus.

By means of rotating the threaded spindle 25 when the coupling 29 is disengaged, the supporting angle 21 with the container 16 is lowered until the bars 36, 37 release the lowermost intermediate layer 30 and the latter falls onto the floor 19 of the container 16 under the influence of gravity. After this adjustment, the supply magazine 4 with uncoated plates 5 is inserted, the housing 1 is closed and evacuated. After setting the coating requirements the conveyor belt 9 is switched on. At a given point in time the feed for the magazine 4 and the drive for the threaded spindle 25 are connected with the drive of the conveying belt 9 by way of the respective coupling; however, the threaded spindle 25 is first engaged when the first coated plate 5 has been ejected from the conveyor belt 9 into the container 16. The threaded spindle 25 runs synchronously with the conveyor belt 9 in such a way that after the depositing of a coated plate 5 into the container 16 an intermediate layer 30 is released by the bars 36, 37 and falls on the back side of the plate which was stacked last and separates the latter from the layer side of the next plate which is deposited into container 16. This process is repeated during the continuous lowering of the container 16 until the supporting angle 21, which is guided on rollers, strikes against the spring-biased dish 42 which yields under the weight of the filled container until the nut 24 is located in the portion of the threaded spindle 25 which is rotated in an unobstructed manner. Now, the drives can be turned off and the filled container 16 can be removed from the housing 1 after a cooling-off phase.

As can be seen from FIG. 4, the plate 5 has a plurality of planar zones 44 which were provided with an insulating layer before coating with the conductor material. After the removal of the plates from the container 16 the circuit texture is applied and engraved and finally the zones are punched out of the plate and further processed individually. It is important that the sensitive zones 44 be separated from the back side of the plate lying underneath it during the stacking process by means of the intermediate layer 30 accompanied by the formation of an intermediate space, wherein the intermediate layers themselves rest against the plates 5 outside of their useful area as a result of their framelike construction.

In the embodiment example, the container 16 receiving the coated plates 5 is constructed simultaneously as a magazine for the intermediate layers 30. In further modification a magazine may be separate from the container 16 or be arranged in the container 16 or outside of in order to accommodate the intermediate layers. Instead of separate intermediate layers, intermediate layers which are chained together at one end and which lie one on top of the other in zigzag form, each of them including one plate, can also be used.

It will be understood that each of the elements described above, or two or more together, may also find a useful application in other types of stacking devices for uniform plate-like pieces differing from the types described above.

While the invention has been illustrated and described as embodied in a stacking device for uniform plate-like pieces, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

I claim:

1. Stacking device for uniform platelike pieces having a front side to be treated and a back side, the device comprising a conveying device conveying said pieces which are treated on said conveying device to produce a sensitive treated surface on the front side of each piece; a movable container means for receiving said pieces advanced by said conveying device to said container means in such a way that they are deposited and stacked in said container means such that a front side of one piece is against a back side of the other piece; and means to protect the sensitive treated surface on the front side of each piece deposited in the container means against contact with the back side of a previously deposited piece in said container means, said means to protect the sensitive treated surface including intermediate layers introduced between each two consecutive deposited pieces in said container means, each intermediate layer being formed as an inherently rigid frame which rests only on border areas of the front and back sides of each of said pieces; and a means for introducing said intermediate layers between two consecutive deposited pieces and releasing said intermediate layers as said container means is moved opposite to a stacking direction during a stacking process, said means for introducing said intermediate layers between two consecutive deposited pieces and releasing said intermediate layers being arranged in said container means, and said container means being open toward said conveying device.

2. Stacking device according to claim 1, wherein said intermediate layers (3) are positioned in said container.

3. Stacking device according to claim 2, wherein said intermediate layers (30) are supported in said container such that a free space (38) is left open for the depositing of each piece (5).

4. Stacking device according to claim 3; further including a carrier formed as an angle piece (21) and assigned to said container (16), said angle piece being continuously guided so as to be displaceable in the movement direction of said container.

5. Stacking device according to claim 4, further including a gear unit, a feed rate of which is adapted to that of said conveying device (8), said unit continuously moving said container (16).

6. Stacking device according to claim 1, wherein said intermediate layers (30) are arranged in a magazine; and further including a device for transporting and releasing said intermediate layers provided in said magazine between two consecutive deposited pieces.

7. Stacking device for uniform platelike pieces having a front side to be treated and a back side, the device comprising a conveying device conveying said pieces which are treated on said conveying device to produce a sensitive treated surface on the front side of each piece; a movable container receiving said pieces advanced by said conveying device to said container in such a way that they are deposited and stacked in said container such that a front side of one piece is against a back side of the other piece, said container (16) being open toward said conveying device (8) and is movable opposite to a stacking direction during a stacking process, said container also having two parallel walls (17,18) and bars (36,37); means to protect the sensitive treated surface on the front side of each piece deposited in the container against contact with the back side of a previously deposited piece in said container, said means including intermediate layers introduced between each two consecutive deposited pieces in said container, each intermediate layer being formed as an inherently rigid frame which rests only on border areas of the front and back sides of each of said pieces, said intermediate layers (30) being positioned in said container and supported in said container such that a free space (38) is left open for the depositing of each piece (5), said intermediate layers (30) being supported so as to be swivelable at said two parallel walls in the vicinity of their rear defining edges and being supported by the opposite edge facing said conveying device (8) at said bars (36,37), which are arranged so as to be integral with the device and which extend in a movement direction of said container (16), said intermediate layers being in an inclined position in said container; and a device for introducing said intermediate layers between two consecutive deposited pieces and releasing said intermediate layers, said device being arranged in said container.

8. Stacking device according to claim 7, further including an angle piece (21) assigned to said container (16) and continuously guided so as to be displaceable in a movement direction of said container.

9. Stacking device for uniform platelike pieces having a front side to be treated and a back side, the device comprising a conveying device conveying said pieces which are treated on said conveying device to produce a sensitive treated surface on the front side of each piece; a movable container receiving said pieces advanced by said conveying device to said container in such a way that they are deposited and stacked in said container such that a front side of one piece is against a back side of the other piece; means to protect the sensitive treated surface on the front side of each piece deposited in the container against contact with the back side of a previously deposited piece in said container, said means including intermediate layers introduced between each two consecutive deposited pieces in said container, each intermediate layer being formed as an inherently rigid frame which rests only on border areas of the front and back sides of each of said pieces; a gear unit, a feed rate of which is adapted to that of said conveying device (8), said unit continuously moving said container (16), said gear unit including a threaded spindle (25) which is supported so as to be integral with the device, and a nut (24), said nut being penetrated by said spindle and being fastened to said container (16), said nut (24) consisting of two threaded half shells which are openable.

10. Stacking device according to claim 9, further including a detachable coupling (29) arranged between said threaded spindle (25) and a motor for driving the spindle (25).

* * * * *